United States Patent
Vassiliev

(10) Patent No.: US 6,197,705 B1
(45) Date of Patent: Mar. 6, 2001

(54) METHOD OF SILICON OXIDE AND SILICON GLASS FILMS DEPOSITION

(75) Inventor: Vladislav Vassiliev, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 09/270,598

(22) Filed: Mar. 18, 1999

(51) Int. Cl.$^7$ .................................................. B05D 3/06

(52) U.S. Cl. ...................... 438/789; 438/778; 438/788; 438/790

(58) Field of Search ........................... 438/788, 789, 438/790, 778

(56) References Cited

U.S. PATENT DOCUMENTS

| | | | |
|---|---|---|---|
| 5,271,972 | 12/1993 | Kwok et al. | 427/579 |
| 5,362,526 | * 11/1994 | Wang et al. | 427/573 |
| 5,593,741 | * 1/1997 | Ikeda | 427/579 |
| 5,643,838 | 7/1997 | Dean et al. | 437/238 |
| 5,933,760 | * 8/1999 | Iyer et al. | 438/778 |

FOREIGN PATENT DOCUMENTS 4-38829 * 2/1992 (JP) .......................... H01L/21/316

OTHER PUBLICATIONS

"The Electric Properties of CVD Silicon Oxide Films for Applications as Interlayer Dielectrics in USLI", 1997 IEEE Annual Report, Loiko et al., Conference on Electrical Insulation and Dielectric Phenomena, Oct. 10–22, 1997.*

* cited by examiner

Primary Examiner—Charles Bowers
Assistant Examiner—Lisa Kilday
(74) Attorney, Agent, or Firm—George O. Saile; Rosemary L. S. Pike; William J. Stoffel

(57) ABSTRACT

A method for fabricating a silicon oxide and silicon glass layers at low temperature using soft power-optimized Plasma-Activated CVD with a TEOS-ozone-oxygen reaction gas mixture (TEOS $O_3/O_2$ PACVD) is described. It combines advantages of both low temperature Plasma-Enhanced Chemical Vapor Deposition (PECVD) and TEOS-ozone Sub-Atmospheric Chemical Vapor Deposition (SACVD) and yields a coating of silicon oxide with stable and high deposition rate, no surface sensitivity, good film properties, conformal step coverage and good gap-fill. Key features of the invention's $O_3/O_2$ PACVD process are: a plasma is maintain throughout the entire deposition step in a parallel plate type reactor chamber, the precise RF plasma density, ozone concentration in oxygen and the deposition temperature. These features provide the reaction conditions for the proper $O_3/O_2$ reaction mechanism that deposits a conformal silicon oxide layer. The process has significant implication for semiconductor device manufacturing involving the deposition of a dielectric over a conducting non-planar surface.

5 Claims, 7 Drawing Sheets

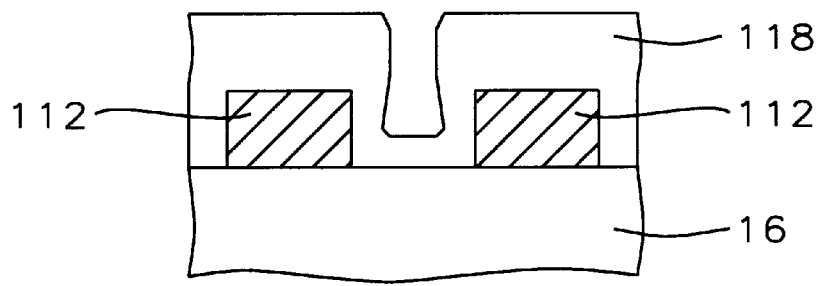
*FIG. 1 - Prior Art*
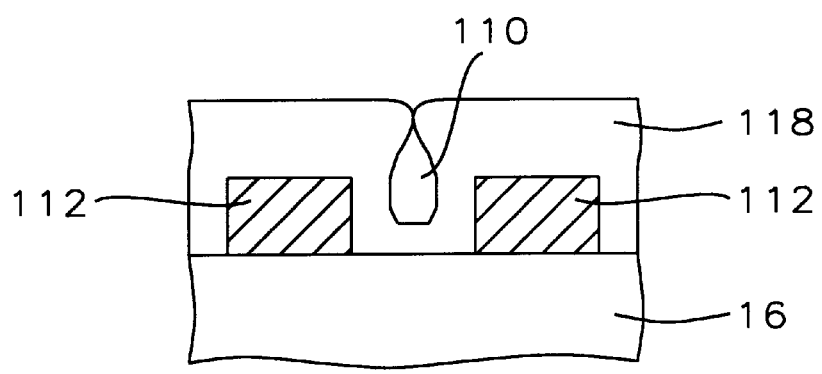
*FIG. 2 - Prior Art*
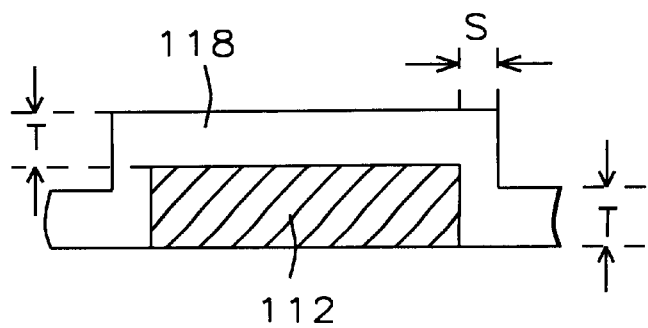
*FIG. 3*

| SHAPE OF FILM PROFILE ON THE RECTANGULAR IN SECTION LINE | TYPE OF FILM PROFILE | REACTION PATH, FIGURE | $K_{EFF}$ (CM/S) | EXAMPLES |
|---|---|---|---|---|
| 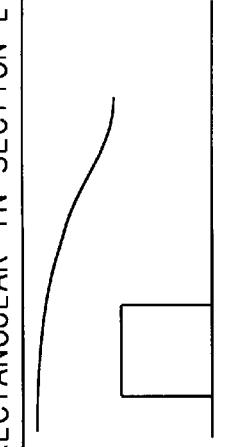 | FLOW-LIKE PROFILE | 3RD (FIG 7B) | ~0.1–0.2 | TEOS-OZONE SACVD |
| 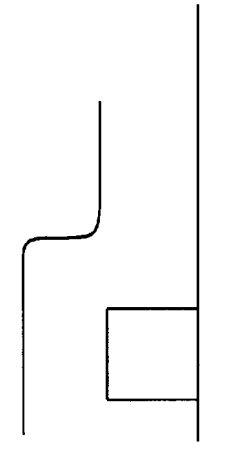 | CONFORMAL PROFILE | 1ST (FIG 7A) | ~0.4 | TEOS DECOMPOSITION AT LOW PRESSURE |
|  |  | 2ND WITH LIMITING HETEROGENEOUS STEP (FIG 7A) | ~0.3 | LOW-PRESSURE SILICON NITRIDE FROM DICHLOROSILANE AND AMMONIA |
| 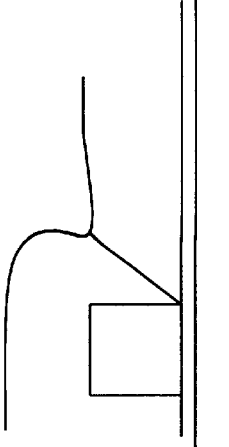 | NON-CONFORMAL PROFILE WITH SLIGHT SEAMS | 2ND WITH LIMITING HETEROGENEOUS STEP (FIG 7A, 7C) | ~0.5–1 | OPTIMIZED PECVD-FSG, PECVD-LTO, PECVD-BPSG |

*FIG. 8A*

| SHAPE OF FILM PROFILE ON THE RECTANGULAR IN SECTION LINE | TYPE OF FILM PROFILE | REACTION PATH, FIGURE | $K_{EFF}$ (CM/S) | EXAMPLES |
|---|---|---|---|---|
| | STRONGLY NON-CONFORMAL PROFILE WITH THE STRONG SEAMS | 2ND WITH LIMITING HETEROGENEOUS STEP (FIG 7A, 7C) | ~1-2 | HIGH POWER PECVD-LTO, PECVD-BPSG, PECVD-PSG MONOSILANE-NOTROUS OXIDE |
| | STRONGLY NON-CONFORMAL PROFILE WITH FILM INTEGRITY BREAKS IN THE BOTTOM CORNER | 2ND WITH LIMITING HETEROGENEOUS STEP (FIG 7A, 7C) | >>2 | EXTREMELY HIGH POWER OR NON-OPTIMIZED PECVD-LTO PECVD-BPSG, PECVD-PSG, OXIDE FILMS FROM MONOSILANE |

FIG. 8B

METHOD OF SILICON OXIDE AND SILICON GLASS FILMS DEPOSITION

BACKGROUND OF THE INVENTION

1. Field of the Invention

This invention relates generally to fabrication of semiconductor devices and more particularly to the fabrication of a silicon oxide and silicon glass deposition using a combined power-optimized Plasma-Activated CVD with tetraethoxysilane-ozone-oxygen reaction gas mixture (TEOS-$O_3$/$O_2$ PACVD).

2. Description of the Prior Art

In the fabrication of devices such as semiconductor devices, a variety of material layers is sequentially formed and processed on the substrate. (For the purpose of this disclosure, the substrate includes a bulk material such as semiconductor, e.g., silicon, body, and if present, various regions of materials such as dielectric materials, conducting materials, metallic materials, and/or semiconductor materials). Often, one of the material regions utilized in this fabrication procedure includes a silicon oxide, i.e., a material nominally represented by the formula $SiO_n$, where n=~2. For example, silicon oxide regions are utilized as insulating/passivating layers as electrical insulation between conducting layers, e.g., polysilicon or metal layers, and as a cap doped semiconductor layers to limit unacceptable dopant migration during subsequent processing.

A silicon oxide is often deposited on a non-planar substrate having a plurality of steps, e.g., conducting steps. Substrate represents a semiconductor structure 10 and overlying layers (e.g., lines 112). It is desirable that the deposited silicon oxide conformally coats this non-planar surface. If a conformal silicon oxide layer is not achieved, an irregular coating, (118 in FIG. 1), forms over the underlying steps, 112. If deposition is continued, voids, 110, as shown in FIG. 2, are often produced. An irregular coating such as shown in FIG. 1 is, in many situations, unacceptable because a non-planar surface degrades the resolution of subsequent photolithography. Voids such as shown in FIG. 2 are even less desirable because etching and dielectric properties will be non-uniform. In either case, lack of planarity generally produces difficulties in subsequent processing. Therefore, it is very desirable to produce a conformal coating.

The prior art processes do not provide conformal oxide layer that can conformally cover on and between the increasingly tight step features of new semiconductor devices without forming seams.

The importance of overcoming the various deficiencies noted above is evidenced by the extensive technological development directed to the subject, as documented by the relevant patent and technical literature. The closest and apparently more relevant technical developments in the patent literature can be gleaned by considering the following:

U.S. Pat. No. 5,593,741 (Ikeda) Method and apparatus for forming silicon oxide film by chemical vapor deposition—shows oxide and oxynitride film Plasma-Enhanced Chemical Vapor Deposition methods in parallel plate reactor type (PECVD), or electron cyclotron resonance type (ECR) reactor with about 1 second cycled-plasma excitation of the gas mixture to provide cycled concentration of the high degree ionized molecules.

U.S. Pat. No. 5,271,972 (Kwok) Method for depositing ozone/TEOS silicon oxide films of reduced surface sensitivity—teaches a method of depositing good quality thermal CVD silicon oxide layers over a PECVD TEOS/oxygen silicon oxide layer comprising forming an interstitial layer by ramping down the power in the last few seconds of the PECVD deposition. This invention has a step with the lowering of the plasma power of PECVD film deposition that helps to reduce the surface sensitivities of the following TEOS-ozone SACVD oxide.

U.S. Pat. No. 5,643,839 (Dean) Low temperature deposition of silicon oxides for device fabrication—teaches a deposition process involving a plasma struck in a gas including tetraethoxysilane and source of oxygen yields, at low temperatures, conformal coatings of silicon dioxide.

U.S. Pat. No. 5,362,526 (Wang) Plasma-Enhanced CVD process using TEOS for depositing silicon dioxide—teaches a multi-step deposition process. The CVD SiO2 process uses very high chamber pressure and low temperature, and TEOS and ozone reactants. A preferred in-situ multiple-step process for forming a planarized silicon dioxide layer is described. Various combinations of the steps are disclosed for different applications.

SUMMARY OF THE INVENTION

It is an object of the present invention to provide a method for fabricating a silicon oxide layer that combines advantages of both low temperature Plasma-Enhanced Chemical Vapor Deposition (PECVD) and low temperature Sub-Atmospheric Chemical Vapor Deposition (SACVD) using power-optimized Plasma-Activated CVD with TEOS-ozone-oxygen reaction gas mixture (TEOS-$O_3$/$O_2$ PACVD).

It is an object of the present invention to provide a method for fabricating a silicon oxide layer over a stepped surface using power-optimized Plasma-Activated CVD with TEOS-ozone/oxygen reaction gas mixture that produces in oxide layer with rounded comers, not sharp corner or flow-like corners with good integrity of film along the device steps.

The invention shows a soft power-optimized Plasma-Activated CVD with of TEOS-$O_3$/$O_2$ reaction gas mixture. The invention combines the advantages of both low temperature PECVD and SACVD methods. The invention disclosures a process to deposit silicon oxide by a process TEOS $O_3$/$O_2$ PACVD that uses TEOS and $O_3$/$O_2$ gas mixture and soft power-optimized reaction conditions.

A preferred process TEOS-$O_3$/$O_2$ PACVD is shown below in Table 1:

TABLE 1

| Process Parameter | Inventions "soft plasma activation" of TEOS-$O_3$/$O_2$-(dopants) gas mixtures - Estimated range of parameters | example of preferred set of parameters |
|---|---|---|
| wafer temperature (C.) | 300–600 | 450 (425–475) |
| pressure (torr) | 0.2–20 | 9.5 |
| RF frequency (KHz) | 400–1356 | 1350 |
| plasma density (W/cm$^{-2}$) | 0.05–0.5 | 0.2 |
| ozone concentration in ($O_3$/$O_2$) mixture (wt %)) | 0.5–15 | 11.8 |
| Total oxidizer flow rate ($O_3$ + $O_2$) (sccm) | 1000–8000 | 5000 |
| TEOS flow (mgm) | 100–1000 | 400 |
| He flow (sccm) | 1000–6000 | 2000 |
| Wafer spacing (mls) | 200–600 | 250 |

The most critical parameters in the invention are RF plasma density, ozone concentration in oxygen and the deposition temperature.

The invention has the following advantages: stationery CVD process; no surface sensitivity; improvement of step coverage; corner rounding and improvement of film integrity in the bottom corners of structures; power can be used as an addition parameter for management of dopant oxide deposition—simply realized; no need to change chamber design.

The present invention achieves these benefits in the context of known process technology. However, a further understanding of the nature and advantages of the present invention may be realized by the reference to the latter portions of the specification and attached drawings.

BRIEF DESCRIPTION OF THE DRAWINGS

The features and advantages of a semiconductor device according to the present invention and further details of a process of fabricating such as a semiconductor device in accordance with the present invention will be more clearly understood from the following description taken in conjunction with the accompanying drawings in which like reference numerals designate similar or corresponding elements, regions and in which:

FIGS. 1 and 2 are cross sectional views of a conventional oxide film deposition.

FIGS. 3 and 4 are cross sectional views of an oxide film deposition showing methods for measuring/quantizing conformance of the oxide layer over a conductor or stepped surface.

FIGS. 8A and 8B are tables show a correlation of the film step coverage and kinetic parameters of CVD processes for different conditions.

DETAIL DESCRIPTION OF THE PREFERRED EMBODIMENTS

The present invention will be described in detail with reference to the accompanying drawings. In the following description numerous specific details are set forth such as flow rates, pressure settings, thickness, etc., in order to provide a more thorough understanding of the present invention. It will be obvious, however to one skilled in the art that the present invention may be practiced without these details. In other instances, well known process have not been described in detail in order to not unnecessary obscure the present invention. Also, the flow rates in the specification can be scaled up or down keeping the same molar % or ratios to accommodate difference sized reactors as is known to those skilled in the art. Likewise the other process parameters for the invention's processes can be scaled up or down depending on the specifications of the reactor and requirement of future technology products.

I. Background

A. Measurement of Oxide Layer Conformance

Figure 4:
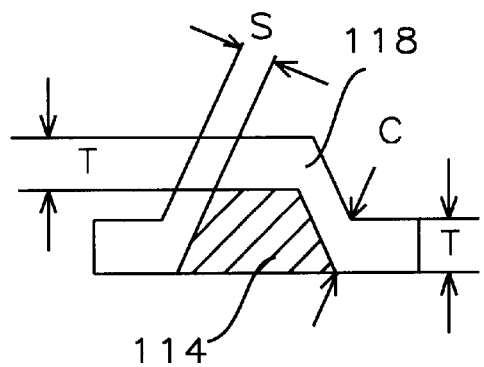

Conformance can be measured using several ways. In case of rectangular shape of conducting lines in section, as shown in FIG. 3, the ratio between dimension S and dimension T, which is the same on the top of line and on the substrate surface, can be used. In the real and more complicated case of non-rectangular shape of conducting lines in section, as shown in section for one example in FIG. 4, more complicated approaches for the conformance characterization have to be used. For instance, in FIG. 4 the same as mentioned above ratio between dimension S and dimension T can be used for characterization of step coverage, and the ratio between dimension C and dimension T can be used for characterization of corner filling/corner rounding. The last one becomes necessary to characterize a flow-like or rounded type of CVD film deposition.

B. Problems of Conventional (A) PECVD and (B) SACVD Processes

The inventor's have determined that previous silicon oxide deposition techniques do not meet the changing requirements of new denser products. It is understood in this regard that no portion of the discussion below is admitted to be prior art as to the present invention. Rather, this highly simplified discussion is an effort to provide an improved understanding of the problems that are overcome by the invention.

There are two basic low temperature undoped/doped silicon glass deposition techniques: (1) low-temperature Plasma-Enhanced deposition (PECVD-LTO, PECVD-PSG, PECVD-BPSG, etc); and (2) low-temperature Sub-Atmospheric pressure TEOS-ozone deposition (SACVD-USG, SACVD-PSG, SACVD-BPSG, etc). The general characteristics of both methods are listed in the Table 2 below. Comparison of methods shows that both methods have obvious advantages and disadvantages that limited their usage in technology for devices with small features.

TABLE 2

| Deposition method | Advantage | Disadvantage |
|---|---|---|
| PECVD - prior art | 1 Stationery CVD process<br>2. No surface sensitivity | 1. Poor step coverage ands seams appearance, especially for doped films 2. Bad gap-fill |
| | 3. High deposition rate<br>4. Good film properties because of low film porosity<br>5. There is a correlation of the deposition rate for doped films with the dopant concentration | 3. Bad film integrity along the step of conducting line. |

TABLE 2-continued

| Deposition method | Advantage | Disadvantage |
|---|---|---|
| | but power can be used as an additional parameter to manage the CVD process | |
| TEOS-O3/O2 SACVD - prior art | 1. Flow-like step coverage<br>2. Excellent gap-fill | 1. Non-stationery process<br>2. surface sensitivity of chemical reaction. - need to suppress it by pre-treatment or liner pre-deposition<br>3. Additional surface pre-treatment or in-situ line pre-deposition need to be used to suppress the surface sensitivity<br>4. Low deposition rate<br>5. Poor film properties because of high film porosity.<br>6. Strong dependence of doped oxide deposition rate on the dopant to TEOS ratio.<br>7. There is a strong correlation between the deposition rate and the dopant concentration in doped SACVD films, |
| Invention: power-optimized Plasma-Activated CVD (PACVD) with oxygen-ozone reaction gas mixture. | 1. Stationery process<br>2. No surface sensitivity<br>3. High deposition rate<br>4. Good step coverage and gap-fill<br>5. Good film integrity along the step of conducting line<br>6. Good film properties because of low film porosity<br>7. There is a correlation of the deposition rate for doped films with the dopant concentration, but power can be used as an additional parameter to manage the CVD process | |

Conclusions: the advantages of TEOS-ozone SACVD can not be used because of non-stationery surface sensitive process with poor film quality. Also, the advantages of PECVD processes cannot be used because of poor step coverage and gap-fill. Advantages of both methods can be achieved using "soft plasma activation" of TEOS-$O_3$/$O_2$-(dopants) gas mixtures in optimized process conditions, (PACVD).

C. FIG. 5A (PECVD-LTO)

Figure 5A:
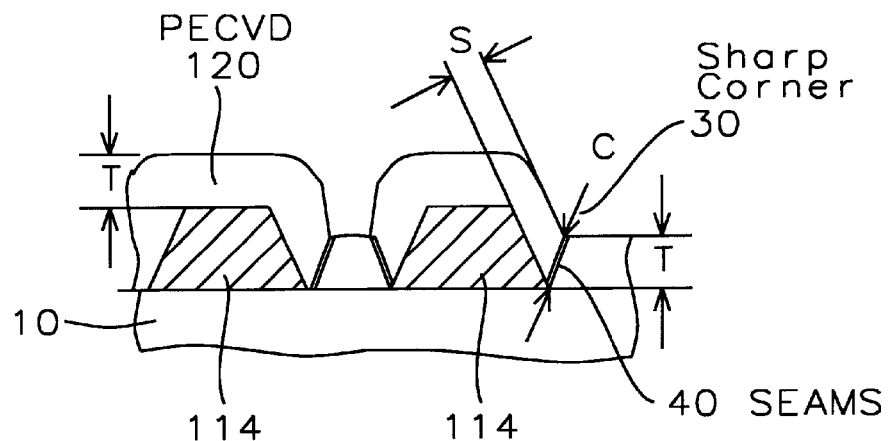
FIG. 5A is a cross sectional view for illustrating a method for forming a silicon dioxide layer over conducting lines according to a PECVD Low Temperature Oxide (PECVD-LTO) prior art process.

FIG. 5A shows the following problems usually seen in PECVD deposition:

a) differences in the film deposition rate over the conducting lines T (or, that is the same, on the flat substrate surface) and on the side walls of structures S (this phenomenon is more pronounced for rectangular shape of conducting lines in section, as shown for instance, FIG. 1);

b) sharp corners 30 of the PECVD-LTO oxide layer 120 when formed over conducting lines 114, which have in this particular example non-rectangular shape in section and which are worse for rectangular shape of conducting line in section;

c) thin seams 40 crossing the deposited film from the bottom of structures to the top of film, which are more pronounced for rectangular shape of conducting lines in section.

All these mentioned phenomena a), b) and c) are caused by intensive reactions in the gas phase consisted of precursor and oxidizer. These gas-phase reactions are the result of the interaction of highly active radicals formed in the gas-phase due to the excitation with high density RF power.

All these effects: a), b) and c) cause the problems of film itself such as bad gap-filling, bad film integrity on the side walls and, especially, in the bottom corners of structures. Moreover, these effects enhance the problems with gap-fill and step coverage of doped films deposited over silicon dioxide film when it is used as a liner before the deposition of doped film.

Semiconductor structure 10 can represent the top surface of a dielectric layer, a conductive layer; a combination of a dielectric layer and conductor; or a wafer surface.

D. SACVD-USG—FIG. 5B

Figure 5B:
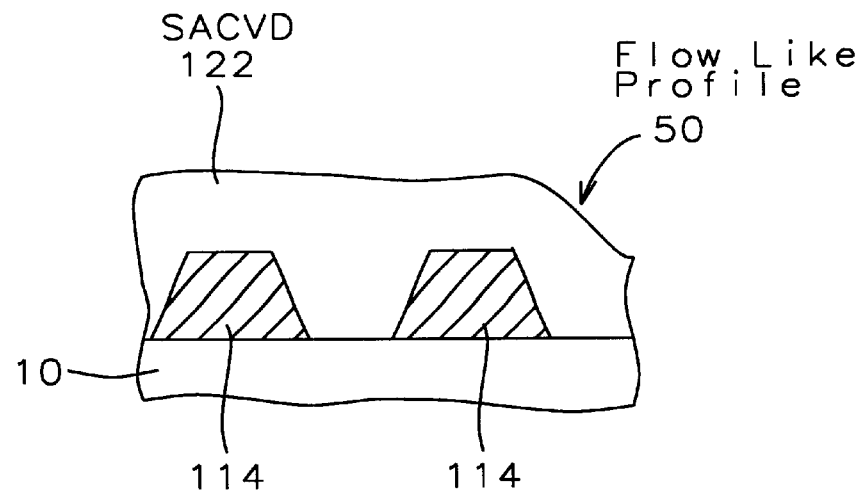
FIG. 5B is a cross sectional view for illustrating a method for forming a silicon dioxide layer over conducting lines according to the prior art process of Sub-Atmospheric pressure Undoped Silicon Glass deposition (SACVD-USG).

Referring to FIG. 5B, SACVD-USG layer 122 shows an shape of film in section or flow-like profile 50 that is due to the very specific CVD reaction. The flow-like profile 50 as well as the effect of surface sensitivity mean the differences in the film deposition rate on the different substrates or underlayers (deposition rate on silicon is about 2 times faster than that of oxide or nitride underlayer) and gradual change of deposition rate with deposition time, as shown in FIG. 6.

Figure 6:
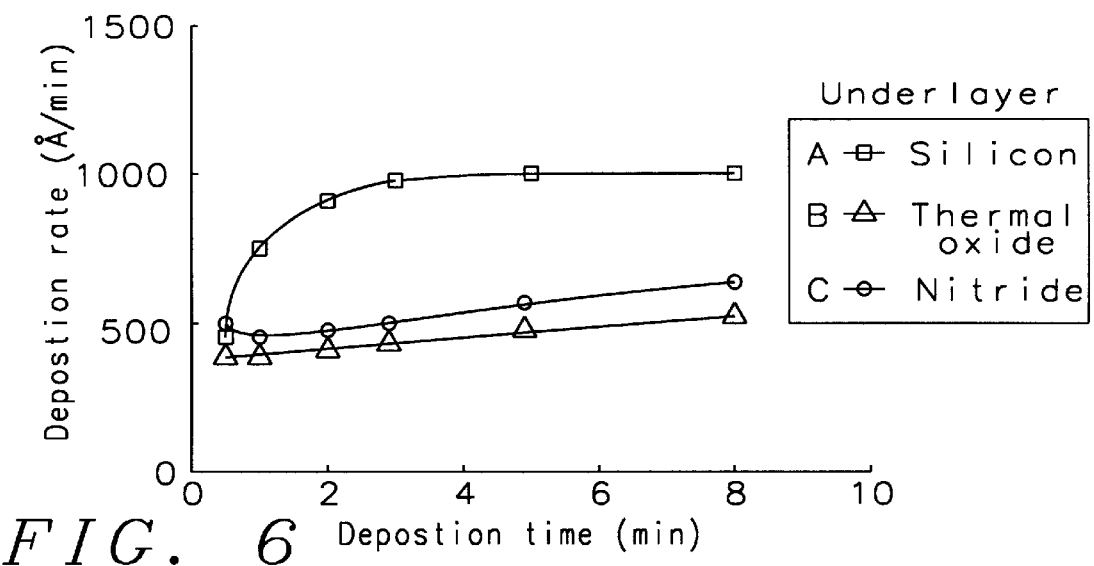
FIG. 6 is an example of non-stationary TEOS-ozone silicon dioxide SACVD process at different substrates/underlayers.

FIG. 6 is an example of non-stationary TEOS-ozone silicon dioxide SACVD process at different substrates/underlayers. FIG. 6 shows the $SiO_2$ deposition rate as a function of deposition time on 3 different composition underlayers. The $SiO_2$ is formed on (a) Si (b) thermal oxide and (c) nitride. FIG. 6 shows changes in the silicon oxide deposition rate in TEOS-OZONE SACVD with the deposition time for Si substrate, Si substrate pretreated with a thermal oxide layer and a Si substrate pre-coated with silicon nitride. FIG. 6 shows that there the oxide growth rate is also double on Si compared to Thermal oxide.

The last process property means the non-stationery type of the CVD process. The reaction mechanism of TEOS and ozone interaction is rather unknown at the moment despite of the known attempt to explain it as a formation of low-flowable organic intermediate products called "oligo-mers" in gas phase followed by their flowing on the film surface. But there is no any evidence so far, which could prove the ability of such low temperature flowing of silicon-oxygen contained substances.

An alternative explanation of this effect, which is based on chemical kinetics, is the following. TEOS and ozone can adsorb separately on the growing film surface at low temperature and furthermore react to form silicon dioxide film. Because of different adsorption coefficient for TEOS and ozone on the different substrates/underlayers (that means different concentration of these species in adsorption layer), the deposition rates on different substrates/underlayers are different. In this case the flow-like profiles are the results of the higher concentration of the adsorbed species near the bottom steps of conducting layers that causes the relative increase of deposition rate in the corners of the structures.

The surface sensitivity effect causes the flow-like profile 50 and the following set of problems: different film properties on the conducting steps, namely on the top of lines and on the side walls like film surface roughness, film density and film etch rate. It is known that TEOS-ozone SACVD is non-stationery reaction that means difficulties with managing of the CVD process and the film properties in general are much worse that those of PECVD films, namely film density and porosity.

II. Invention's TEOS-$O_2$/$O_3$ PACVD Process

Figure 5C:
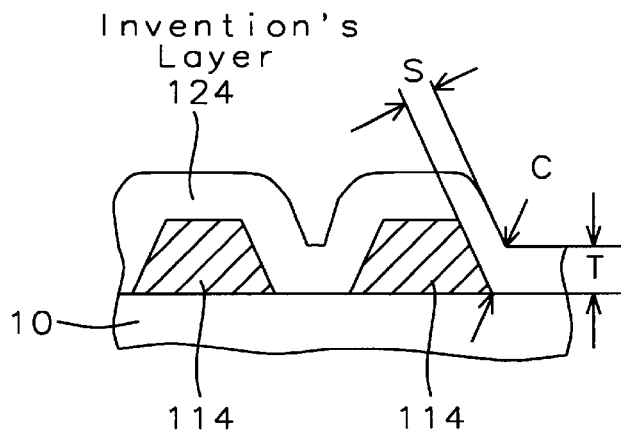
FIG. 5C is a cross sectional view for illustrating a method for forming a silicon dioxide layer over conducting lines according to the present invention's TEOS-$O_3$/$O_2$ PACVD process.

FIG. 5C shows the oxide layer formed using the invention's novel power-optimized TEOS $O_3$/$O_2$ Plasma- Activated CVD that produces an oxide layer 124 with rounded corners 60, not sharp corners nor flow-like corners. The oxide layer 124 is formed over conducting lines or other stepped structures 114. The Table 3 shows the characterization of conformance for the structures presented in FIG. 5A and FIG. 5C, namely: the Ratio 1, which is the ratio of dimension C to dimension T (Ratio 1=C/T), and the Ratio 2, which characterizes the ratio of dimension S to dimension T (Ratio 2=S/T).

TABLE 3

| CVD process | Ratio 1 (C/T) | Ratio 2 (S/T) | Oxide deposition rate* (Å/min) |
|---|---|---|---|
| PECVD-LTO, prior art - FIG. 5A | 1.02–1.05 | 0.60–0.64 | 1220–1300 |
| TEOS-O3/O2 PACVD === Invention's power-optimized process - FIG. 5C | 1.19–1.25 | 0.85–0.90 | 1360–1400 |

*For any substrate/underlayer: silicon, silicon nitride, silicon dioxide

In summary: the advantages of TEOS-ozone SACVD (prior art) can not be used because of poor film quality. The advantages of PECVD cannot be used because of poor step coverage. The advantages of both methods can be combined using the invention's "soft plasma activation" of TEOS-$O_2$/$O_3$ (dopants) gas mixture in Power assisted and optimized process conditions.

A. Advantages of the Invention's "Soft Plasma Activation" of TEOS-$O_3$/$O_2$-(dopants) Gas Mixtures in Optimized Process Conditions (PA CVD Process).

The invention has the following advantages: stationery deposition rate; no surface sensitivity; improvement of step coverage; rounding of bottom corners—improvement of film integrity in the bottom corners of structures; power can be used as an addition parameter for management of dopant oxide deposition—simply realized, no need to change chamber design.

The invention's process can be performed in any parallel plate type reactors provided necessary wafer heating, equipped with necessary RF-power assemblies, gas supply system and vacuum pumping system without any modification of reaction chamber design. For instance, it can be realized in the "Precision-5000" or "Centura" made by Applied Materials, Inc., or in Novellus's Inc., "Concept" reactors, etc. The reactor can be drawn schematically as any existent type of design, for instants, such in Ikeda's reactors showed in his U.S. Pat. No. 5,593,741 as FIG. 1 and FIG. 8.

Theoretically it is possible to realize the invention in other types of reactor such as ECR or HDP. Nevertheless, it has been considered as non-suitable because of extremely low deposition rate from TEOS and related organosilicon compounds at very low pressures normally used in such reactor types. Due to this reason, it is highly preferred to perform the PACVD process of the invention in any parallel plate type reactor, such as "Precision-5000" or "Centura" made by Applied Materials, Inc., USA.

B. Application of Method of Invention's "Soft Plasma Activation" of TEOS-$O_3$/$O_2$-(dopants) Gas Mixtures in Optimized Process Conditions (PACVD Process).

The invention's "soft plasma activation" of TEOS-$O_3$/$O_2$-(dopants) gas mixtures can be used to make the following type layers: USG films, including liner oxide; borosilicate glass (BSG), phosphosilicate glass (PSG) and borophosphosilicate glass (BPSG) films, and fluorinated glass deposition using TEOS and fluorotriethoxysilane (or FTES, SiF(OC$_2$H$_5$)$_3$).

C. Detailed Description of Invention's Undoped Silicon Oxide Deposition Process

This invention's non-surface sensitive method provides the improvement of the step coverage and rounding of film in the corners using 1 step deposition process in parallel plate type reaction chamber. Detailed parameters of the invention's Plasma Activated Chemical Vapor Deposition (PACVD) process for deposition of undoped silicon glass are shown in Table 4:

TABLE 4

Invention's $O_3/O_2$ PACVD oxide process

| Process parameter | Estimated range of parameters | Most preferred range of parameters |
|---|---|---|
| wafer temperature (° C.) | 300–600 | 425–475 |
| pressure (torr) | 0.2–20 | 6–14 |
| plasma density (W/cm-2) | 0.05–0.5 | 0.1–0.3 |
| plasma frequency (KHz to MHz) | 4.00 KHz–13.56 MHz | 13.56 MHz |
| TEOS flow (mgm) | 100–1200 | 400–800 |
| oxidizer | $O_3/O_2$ mixture | $O_3/O_2$ mixture |
| ozone concentration in oxygen (wt %) | 0.5–15 | 10–13 |
| Total oxidizer flow rate ($O_3 + O_2$) (sccm) | 1000–8000 | 3000–6000 |
| Carrier gasses | Ar, He | He |
| carrier flow (sccm) | 1000–6000 | 1500–3000 |
| Wafer spacing (mls) | 200–600 | 250 |

The process parameters presented in Table 4 can be used for the invention's PACVD oxide layer that is doped with boron and/or phosphorous (the borosilicate, phosphosilicate and borophosphosilicate glass films) using organic ethers, such as trimetylborate, triethylbirate, trimethylphosphite, trimethylphosphate, triethylphospohate, tripropylphosphate, etc. In this case particular flows of precursors are chosen based on boron and phosphorus concentration need to be achieved. Likewise, the ratio of organic boric and phosphoric acid ethers flows to TEOS flow are chosen based on the desirable concentration of boron and phosphorus in the glass.

Similar process parameters can be used for deposition of fluorinated films (FSG) using a mixture of TEOS and FTES. In this case the total flow of TEOS and FTES assumed to be equal to the TEOS flow presented in Table 4, and the share of TEOS and FTES in total silicon compound flow will depend on the final fluorine concentration need to be achieved. The ratio of fluorotriethoxysilane to tetraethoxysilane are chosen based on the desirable concentration of fluorine in the glass.

Figure 7A:
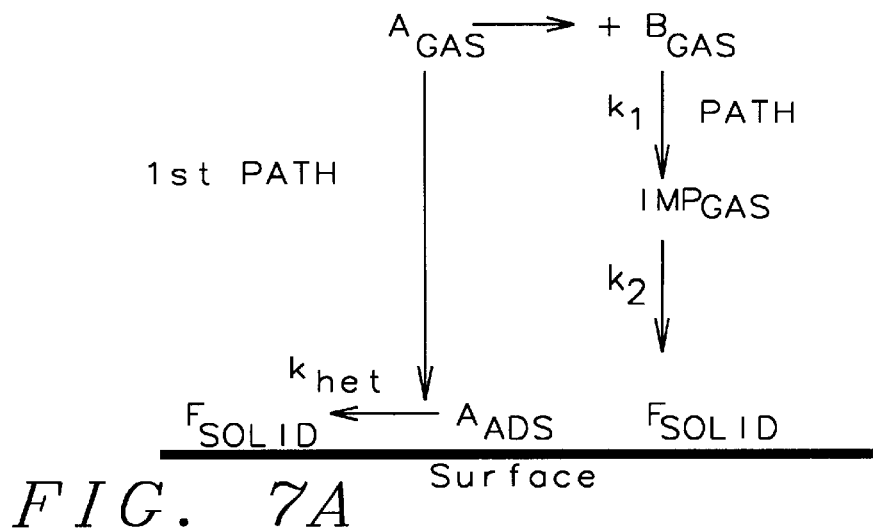
FIG. 7A is a kinetic scheme of generalized multi-path and multi-step CVD process.

The most important parameters in the invention are RF plasma density, ozone concentration in oxygen and the deposition temperature that can be clear understood with the following explanation of the Invention's idea. It is known that any chemical deposition process is very complicated and it includes many particular chemical reaction steps. Based on previously published investigation of the gas-phase CVD reaction kinetics of polysilicon, silicon nitride, silicon dioxide, phosphosilicate, borosilicate and borophosphosilicate glasses, a generalized multi-path and multistage CVD process approach 1 has been developed to explain the reason of observed reaction differences and features. According to this simplified approach, an interaction between precursor $A_{gas}$ (silicon compound) and compound $B_{gas}$ ($O_2$, $NH_3$, $N_2O$, etc.) proposed to be in two possible paths: either a heterogeneous (1st) path or a two-step ($2^{nd}$) path with the homogeneous gas-phase formation of intermediate product ($IMP_{gas}$) followed by its heterogeneous decomposition into the film on the surface of substrate ($F_{solid}$), as shown in FIG. 7A.

Decomposition processes (like thermal TEOS decomposition in either inert or oxygen ambient at the temperatures higher that 650°) were believed to take place in accordance with the one step 1st reaction path through the formation of adsorbed species ($A_{ads}$,) followed by their transformation into the solid film with the reaction constant $k_{het}$. This explains very uniform film deposition, very good step coverage and gap-fill, and good properties of these films as well.

The reactions of two compounds in most cases were explained using the scheme of the 2nd reaction path with two steps. It was found that there are differences in the basic CVD features (namely step coverage and gap-fill) between used silicon precursors and process conditions. These principal differences in step coverage for studied CVD reactions are shown in FIG. 8. Based on above presented approach they were explained with the difference in the limiting step of CVD process, namely either heterogeneous (k2<<k1) or homogeneous (k1<<k2), as shown in FIG. 8 together with the drawings. Moreover, a comparison of step coverage shows that its worsening correlates with the increase of effective reaction constant $K_{eff}$), i.e., the most efficient and, therefore, activated processes, provides not only high deposition rate, but also bad film step coverage as well. (This effective reaction constant is calculated based on well-known kinetic equation, which in general form for the reaction of two components A and B to form product D (nA+mB=>kD) can be drawn as $W=k^*[A]^n[B]^m$. In this equation W is a reaction rate, k* is a certain coefficient, [A] and [B] are the concentrations of components and power values n and m are the stoichiometric coefficients. To apply this equation to CVD processes, need to use the film deposition rate as a reaction rate W, and concentration of components in the chamber can be calculated based on their flows, process pressure, wafer temperature, and chamber volume. It necessary to note that in the most studied CVD processes there is a first order chemical reaction regarding to the silicon compound and there is zero order reaction with respect to the second reaction component. This means above equation can be rewritten into the following simplified equation $W=K_{eff}$ [Silicon precursor]. The last simplified equation allows us to compare many CVD processes and precursors using very simple approach).

Figures 7B, 7C:
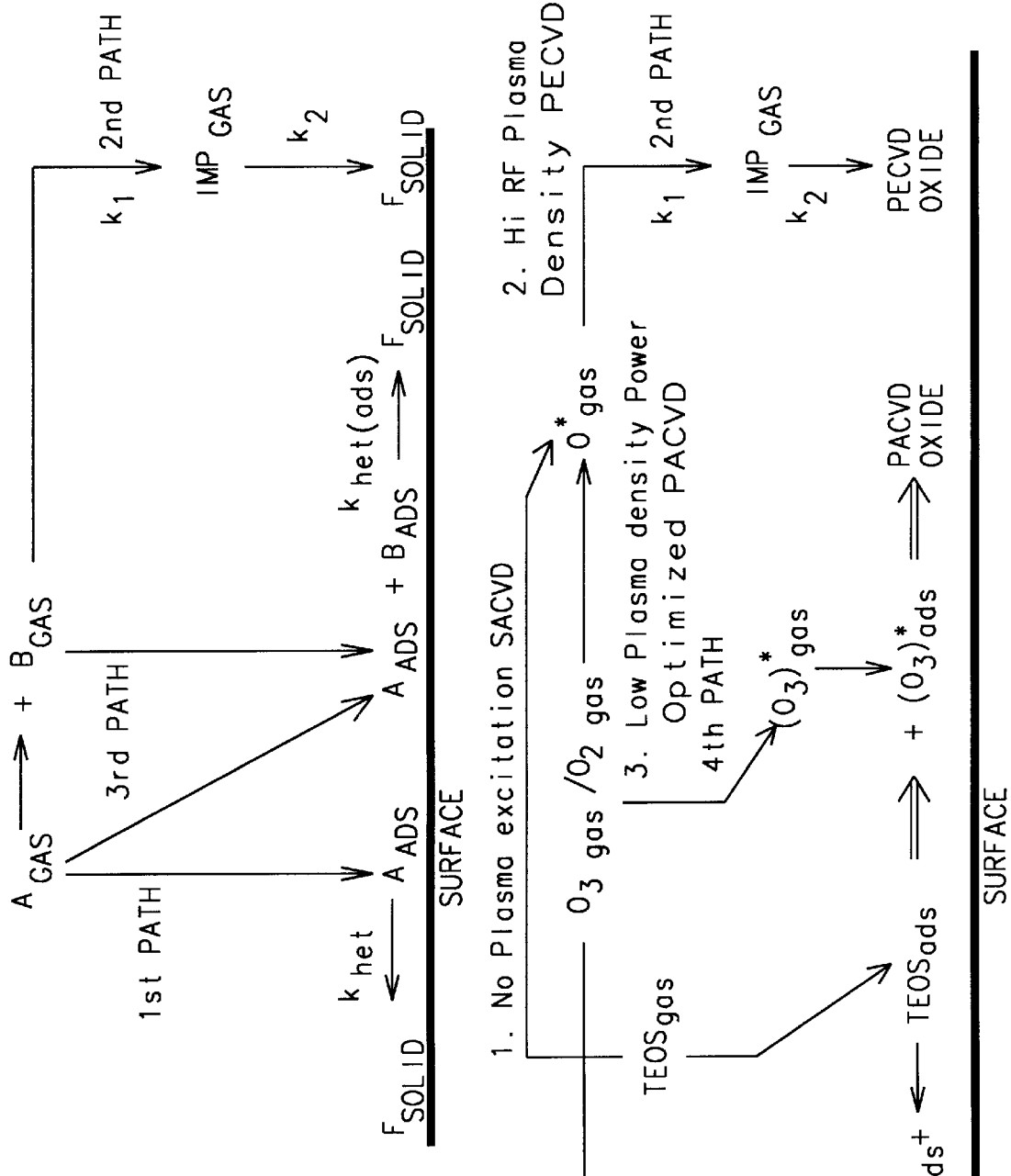
FIG. 7B is a kinetic scheme of modified process with an adsorption path of CVD process, which explain the TEOS-ozone interaction.
FIG. 7C is a kinetic scheme of the power-optimized TEOS-$O_3$/$O_2$ PACVD of the present invention.

There is at least one known exception in the behavior of interaction of two compounds, which could not be explained with the previously developed CVD process scheme shown in FIG. 6A. This is a TEOS-ozone-oxygen CVD process at low temperature. It assumed to be the process with the interaction of two compounds, namely TEOS and ozone, because it is known that TEOS and oxygen almost do not interact at low temperatures. However, observed specific features of this reaction, e.i. non-stationery reaction, surface sensitivity effect, flow-like profile, etc., can be explain using advanced reaction scheme of the general CVD process, which includes the 3', also heterogeneous reaction path, as shown in FIG. 7B. This addition path supposed to have an interaction of adsorbed molecules $A_{ads}$ and $B_{ads}$ on the film surface. Compare to reaction of the 2nd path this reaction is slower.

It has been shown that there is an optimized deposition temperature for TEOS-ozone interaction, which is close to 360–450° C. Behind this temperature region the flow-like profile becomes worse, i.e., closer to usual conformal, but films properties remain almost the same. In accordance with reaction scheme in FIG. 7B it can be explained as follows. The whole TEOS-ozone CVD process can be considered as a combination of two parallel processes, namely 1st and 3rd reaction paths, see FIG. 7B. Depending on the process conditions an impact of each reaction path becomes either higher or lower that eventually causes the changes in observed reaction features. Therefore, the enhancement of the 1st reaction path impact will be corresponded to the partly suppression of the surface sensitivity effect and, therefore, the flow-like profile will be gradually changed to normal conformal step coverage. Finally, it necessary to note that the only ozone provides those very specific oxide deposition features and until recently there is no any information regarding similar behavior of other oxygen sources.

A modified scheme in FIG. 7C can be used for the explanation of the reaction features in the invention's PACVD process, where relatively low and power-optimized RF excitation of gas phase has been employed to manage the CVD process. This scheme also reflect a relationship of Invention's PACVD process with the prior art PECVD and SACVD processes in TEOS-ozone-oxygen reaction mixture. Without RF power density there is the only SACVD process that assumes TEOS and ozone reaction on the surface in accordance with $3^{rd}$ reaction path presented in FIG. 7B. At the high RF power density that means typical PECVD process condition (the major advantage is very high deposition rate), highly active oxygen radicals $O^*_{gas}$, are formed in gas phase in accordance with the $2^{nd}$ reaction path from both oxygen and ozone molecules. After that there is a formation of highly active $IMP_{gas}$ product, which is instantly transformed to the film while achieve substrate surface. In general this CVD process is limited by the homogeneous reaction of the $IMP_{gas}$ formation. This means its features (like the worsening of the step coverage and gap-fill) will be increasing with the increase of the effective reaction constant in accordance with FIG. 8. It is important to note, that in this case the nature of the oxygen source does not significantly matter because of high RF power needed to produce active oxygen radicals to get high deposition rate. In fact, there is no significant difference between oxygen sources described in Ikeda's patent (U.S. Pat. No. 4,493, 741), such as oxygen, ozone, hydrogen peroxide or water. It is also very clear from the scheme in FIG. 7C that the strong excitation of the TEOS-ozone-oxygen mixture during SACVD process will cause the changes of the whole process to the PECVD process.

The invention's PACVD reaction path (see FIG. 7C) assumed to have very soft excitation of ozone-oxygen mixture with the creation of the new, 4th reaction path, due to the soft excitation of ozone molecules. It assumes the formation of "soft-activated" ozone radicals $O_3^*_{gas}$, which are able to adsorb on the surface to form active enough $O_3^*_{ads}$ followed by their reaction with adsorbed TEOS to form PACVD film. It is clear from this scheme that power optimization is very important to produce "soft" activated ozone radicals, but not strong activated oxygen radicals $O^*_{gas}$ because the increase of power will cause the change of reaction to the PECVD process. Such activated TEOS-ozone-oxygen process does not reveal surface sensitivity because of fast interaction of adsorbed TEOS with the adsorbed ozone radicals. Therefore, there is no flow-like profile at this conditions and the possible impact of PECVD process have to be decreased by the careful optimization of process power and ozone concentration in ozone-oxygen mixture. It is important to note that any plasma frequency can be used in proposed region because it is needed just for very soft activation of ozone molecules.

FIGS. 8A and 8B are tables show a correlation of the film step coverage and kinetic parameters of CVD processes for different conditions.

Finally, the summary of important parameters of the invention's PACVD process are presented in Table 5 below:

TABLE 5

| parameter | Reason step is important |
| --- | --- |
| RF plasma dnesity | The increase of plasma density increases the concentration of active oxygen radicals and causes the undesirable activation of reaction mixture that eventually can transform CVD process to the PECVD process |
| Ozone concentration | The higher ozone concentration produces the better step coverage due to the increase of ozone radicals concentration, i.e., the impact of surface reaction into the whole CVD process compare to gas phase reactions of TEOS with oxygen radicals. |
| Deposition temperature | There is an optimized range of deposition temperature with the most effective impact of ozone in the surface reaction. |

D. Insitu Liner/Cap Deposition Before/After insitu PACVD (Doped) Oxide Deposition The invention also provides the following preferred embodiments where a liner layer is formed, and then without removing the wafer from the reactor, the invention's PACVD oxide layer is formed insitu thereover.

The invention includes the following preferred structures/insitu methods:
oxide liner and doped silicon glass PACVD layer.
oxide liner and doped glass PACVD layer and oxide cap layer
oxide liner and fluorosilicate glass layer
oxide liner and fluorosiliciate glass layer and oxide cap layer.

Figure 9:
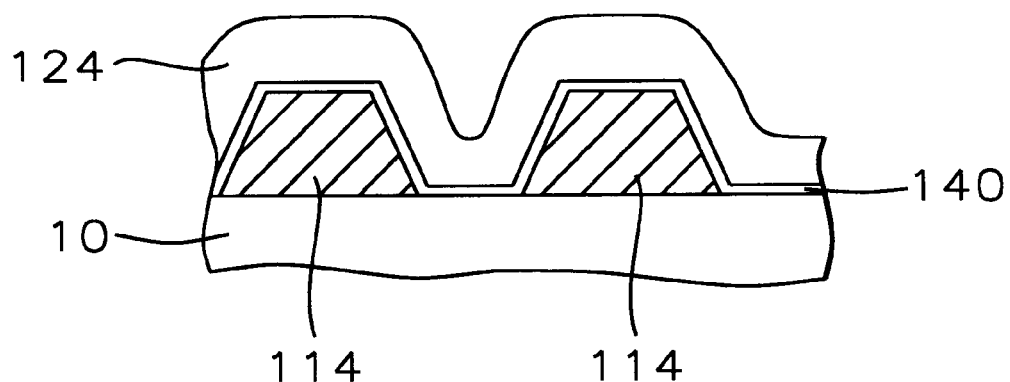
FIG. 9 is a cross sectional view for illustrating a preferred embodiment of a method for forming a silicon dioxide layer over conducting lines which further includes a liner layer 140, according to the present invention's TEOS-$O_3$/$O_2$ PACVD process.
Figure 10:
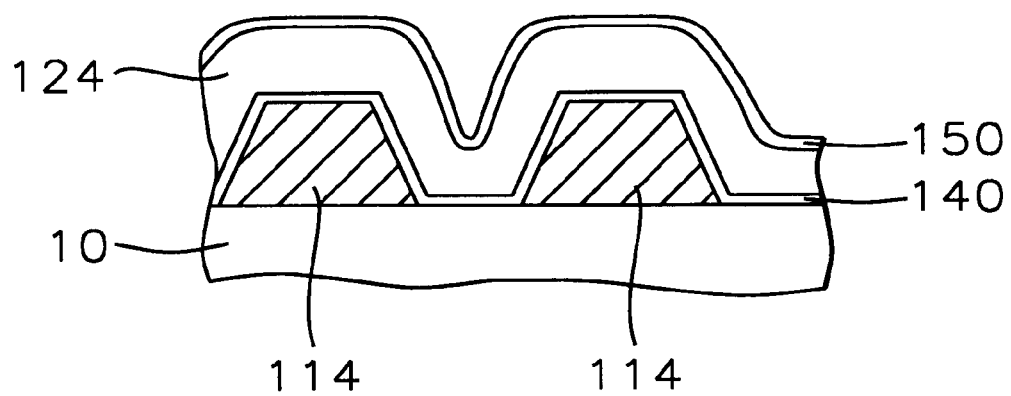
FIG. 10 is a cross sectional view for illustrating a preferred embodiment of a method for forming a silicon dioxide layer over conducting lines which further includes a liner layer 140 and a cap layer 150, according to the present invention's TEOS-$O_3$/$O_2$ PACVD process.

FIG. 9 shows the liner layer 140 which can be formed of an oxide. FIG. 10 shows the liner layer 140 and the cap layer 150. The cap layer is preferably composed of oxide.

E. Differentiation of the Invention over the PECVD and SACVD Processes

The Table 6 below compares the invention's process with the prior art PECVD and prior art SACVD processes and clearly shows the difference between the invention and the prior art processes while realized at the same parallel plate reaction chamber type.

TABLE 6

| | Invention's "soft plasma activation" PACVD | | | |
| --- | --- | --- | --- | --- |
| Process parameter | Estimated range of parameters | PACVD preferred parameters | Prior art PECVD-LTO | Prior art SACVD-USG |
| Wafer temperature (° C.) | 300–600 | 425–475 | 420 | 440 |
| Pressure (torr) | 0.2–20 | 6–14 | 7 | 100–600 |
| Plasma density (W/cm$^2$) | 0.05–0.5 | 0.1–0.3 | 2–3 | NA |
| Plasma frequency (KHz) | 400–1356 KHz | 1356 | 1356 | NA |
| Type of plasma excitation | Constant | Constant | Cycled with 1 second period | NA |
| TEOS flow (mgm) | 100–1200 | 300–600 | 800 | 600 |
| Oxidizer | O$_3$/O$_2$ mixture | O$_3$/O$_2$ mixture | Oxygen | O$_3$/O$_2$ mixture |
| Ozone concentration in oxygen (wt %) | 0.5–15 | 10–13 | NA | 7–12 |
| oxidizer (O$_3$ + O$_2$) flow (sccm) | 1000–8000 | 3000–6000 | NA | 3000–5000 |
| O$_2$ flow rate (seem) | NA | NA | 1000–2000 | NA |
| Addition carrier gases | Ar, He | He | He | He |
| Carrier gas flow (seem) | 1000–6000 | 1500–3000 | 500–1000 | 4000–6000 |
| Wafer spacing (mils) | 200–600 | 230–300 | 200–300 | 200–300 |

As the Table 6 shows, the most important different parameters for the invention are the power density and type of plasma excitation, as well as gas mixture (compare to PECVD prior art) and power density and pressure (compare to SACVD prior art).

Experimental results and measurements are shown in FIGS. 5A, 5B and 5C and FIG. 6 are based on SEMs of cross-sections on actual semiconductor structures.

It should be recognized that many publications describe the details of common techniques used in the fabrication process of integrated components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

Also, the conductive lines in the FIGS can represent any stepped structure on a semiconductor device and are not limited in composition.

While the invention has been particularly shown and described with reference to the preferred embodiments thereof, it will be understood by those skilled in the art that various changes in form and details may be made without departing from the spirit and scope of the invention.

What is claimed is:

1. A method of forming a silicon oxide film over a heated substrate by a Plasma Activated chemical vapor deposition (PACVD) using TEOS and an ozone source as reactants in the constant presence of a plasma; the method comprising the steps of:
   a) placing a substrate in a parallel plate type reactor chamber; said substrate has an upper surface with a plurality of steps;
   b) in a deposition step, inducing a reaction in a gaseous mixture composition to produce deposition of a silicon oxide film over said substrate, said silicon oxide film is deposited by subjecting said substrate to a plasma during all of said deposition step and wherein said composition comprises tetraethoxysilane (TEOS) a source of ozone, and fluorotriethoxysilane; and wherein after said deposition of said silicon oxide film, a corner in said silicon oxide film between said steps is avoided.

2. The method of claim 1 wherein said reaction occurs under the following conditions: a frequency of energy of reaction chamber to produce said plasma is between about 400 KHz and 1356 Khz; and said plasma has a plasma density in the range of between about 0.05 and 0.5 W/cm$^2$; and said source of ozone is a $O_3/O_2$ mixture with an Ozone concentration in oxygen between 10 and 13 wt % and said $O_3/O_2$ mixture has a flow rate between 3000 and 6000 SCCM; and at a temperature of said substrate between about 300 and 500° C.

3. The method of claim 1 wherein said reaction occurs under the following conditions:

a Wafer temperature between 300 and 500° C., a Pressure between 0.2 and 20 torr, a Plasma density between 0.05 and 0.5 W/cm$^2$, a Plasma frequency between 400 and 1356 KHz, said source of ozone is a $O_3/O_2$ mixture with an Ozone concentration in oxygen between 10 and 13 wt % and said $O_3/O_2$ mixture has a flow rate between 3000 and 6000 SCCM; and He Carrier gas flow between 1000 and 6000 sccm; and a Wafer spacing between 200 and 600 mils.

4. The method of claim 1 wherein said reaction occurs at the following conditions:

a Wafer temperature between 380 and 440° C., a pressure between 6 and 14 torr; a Plasma density between 0.1 and 0.3 W/cm$^2$; a Plasma frequency between 1350 and 1360 KHz; a TEOS flow between 300 and 600 mgm; said source of ozone is a $O_3/O_2$ mixture with an Ozone concentration in oxygen between 10 and 13 wt % and said $O_3/O_2$ mixture has a flow rate between 3000 and 6000 SCCM; a He Carrier gas flow between 1500 and 3000 sccm; a Wafer spacing between 230 and 300 mils.

5. The method of claim 1 wherein said prior to said deposition step; performing insitu an oxide liner step to form on oxide liner over said substrate and then performing said deposition step to deposit said silicon oxide film over said oxide liner.

* * * * *